(12) United States Patent
Bae et al.

(10) Patent No.: US 9,543,384 B2
(45) Date of Patent: Jan. 10, 2017

(54) SEMICONDUCTOR PACKAGE (71) Applicant: SK hynix Inc., Icheon-si Gyeonggi-do (KR)

(72) Inventors: Han Jun Bae, Seoul (KR); Won Duck Jung, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/850,385

(22) Filed: Sep. 10, 2015

(65) Prior Publication Data
US 2016/0254251 A1 Sep. 1, 2016

(30) Foreign Application Priority Data

Feb. 26, 2015 (KR) .................. 10-2015-0027589
Jun. 15, 2015 (KR) .................. 10-2015-0084339

(51) Int. Cl.
H01L 23/495 (2006.01)
H01L 25/065 (2006.01)
H01L 29/06 (2006.01)
H01L 23/14 (2006.01)
H01L 23/498 (2006.01)

(52) U.S. Cl.
CPC ......... *H01L 29/0657* (2013.01); *H01L 23/145* (2013.01); *H01L 23/4985* (2013.01); *H01L 23/49811* (2013.01); *H01L 23/49827* (2013.01); *H01L 23/49833* (2013.01); *H01L 23/49838* (2013.01); *H01L 2224/04042* (2013.01); *H01L 2224/05624* (2013.01); *H01L 2224/05647* (2013.01); *H01L 2224/45139* (2013.01); *H01L 2224/45144* (2013.01); *H01L 2224/45147* (2013.01); *H01L 2224/48091* (2013.01); *H01L 2224/73265* (2013.01); *H01L 2924/10158* (2013.01); *H01L 2924/3511* (2013.01)

(58) Field of Classification Search
CPC ................. H01L 232/49513; H01L 23/49524; H01L 24/05; H01L 24/16; H01L 24/32; H01L 24/44; H01L 24/40; H01L 24/48; H01L 24/43; H01L 24/83
USPC ....... 257/666, 782, 773, 774, 668, 784, 786, 257/737, 738, 778
See application file for complete search history.

(56) References Cited

U.S. PATENT DOCUMENTS

| | | |
|---|---|---|
| 5,207,585 A | 5/1993 | Byrnes et al. |
| 6,365,974 B1 | 4/2002 | Abbott et al. |
| 6,995,577 B2 | 2/2006 | Farnworth et al. |
| 2006/0137905 A1* | 6/2006 | Kariya .............. H05K 1/162 174/255 |
| 2010/0072588 A1* | 3/2010 | Yang ............... H01L 23/49816 257/676 |

(Continued)

*Primary Examiner* — Alexander Oscar Williams
(74) *Attorney, Agent, or Firm* — William Park & Associates Ltd.

(57) ABSTRACT

A semiconductor device includes a substrate, an elastic buffer layer disposed on a surface of the substrate, wiring patterns disposed on a first surface of the elastic buffer layer, and a semiconductor chip disposed on a second surface of the elastic buffer layer facing away from the first surface of the elastic buffer layer. The semiconductor chip includes trenches formed on a surface facing the elastic buffer layer. Interconnection members are disposed to electrically connect the elastic buffer layer to the substrate. Each of the interconnection members has one end electrically connected to one of the wiring patterns and the other end electrically connected to the substrate.

19 Claims, 8 Drawing Sheets

(56) References Cited

U.S. PATENT DOCUMENTS

| | | | |
|---|---|---|---|
| 2010/0148325 A1* | 6/2010 | Gruenhagen | H01L 23/49513 257/666 |
| 2011/0204057 A1* | 8/2011 | Hayashi | B65D 47/36 220/277 |
| 2012/0161315 A1* | 6/2012 | Lin | H01L 23/49816 257/738 |
| 2014/0159256 A1* | 6/2014 | Choi | H01L 24/29 257/783 |
| 2014/0266976 A1* | 9/2014 | Lee | H01Q 1/1271 343/906 |
| 2015/0262972 A1* | 9/2015 | Katkar | H01L 21/561 257/48 |

\* cited by examiner

SEMICONDUCTOR PACKAGE

CROSS-REFERENCE TO RELATED APPLICATIONS

The present application claims priority under 35 U.S.C 119(a) to Korean Application Nos. 10-2015-0027589 and 10-2015-0084339 filed on Feb. 26, 2015 and Jun. 15, 2015, respectively, in the Korean intellectual property Office, which are incorporated herein by references in their entirety.

BACKGROUND

1. Technical Field

Various embodiments of the present disclosure generally relate to a packaging technology, and more particularly to semiconductor devices including an elastic buffer layer and a trench.

2. Related Art

With broadening uses of compact, portable electronic systems, semiconductor devices continue to shrink in size. Moreover, demands for high-performance electronic systems have led to many advances in multi-functional semiconductor devices. Recent developments in wearable electronic systems are leading to demands for bendable and flexible semiconductor packages.

A semiconductor package includes a substrate, semiconductor chips mounted on the substrate, an interconnection member for connecting the semiconductor chips to conductive lines on the substrate. It is possible to reduce the thickness of the substrate or semiconductor chips disposed on the substrate so that the semiconductor package can be bent. However, it is difficult for the interconnection member to be bent without damaging its functionality. Tensile stress or compressive stress, which can be applied when the interconnection member is warped or twisted, may cause the interconnection member to be separated from a connection pad or to be broken, and thereby causes the semiconductor package to malfunction. Accordingly, bendable and flexible semiconductor packages require a package structure capable of maintaining the electrical connections between the interconnection members and the semiconductor chips/substrate even when the semiconductor package is warped or twisted.

SUMMARY

According to an embodiment, there is provided a semiconductor device. The semiconductor device includes a substrate, an elastic buffer layer disposed on a surface of the substrate, wiring patterns disposed on a surface of the elastic buffer layer, and a semiconductor chip disposed on another surface of the elastic buffer layer opposite to the substrate. The semiconductor chip includes trenches disposed therein. Interconnection members are disposed to electrically connect the wiring patterns to the substrate. Each of the interconnection members has one end electrically connected to one of the wiring patterns and the other end electrically connected to the substrate.

The elastic buffer layer includes an insulation material having a Young's modulus of about 0.01 GPa to about 0.1 GPa. The insulation material includes one or more of silicone resin and silicone rubber. The semiconductor chip includes a plurality of trenches spaced apart from each other and facing the elastic buffer layer. The trenches have a predetermined depth from a surface of the semiconductor chip facing the elastic buffer layer. The trenches are covered with the elastic buffer layer to provide a cavity. Each of the wiring patterns includes a first portion disposed to overlap with one of the trenches, a couple of second portions extending from both ends of the first portion in two opposite directions and having a curved line shape, and a couple of third portions extending from the second portions in an opposite direction to the first portion and having a straight line shape. Each of the second portions has a sine wave shape. The first portion is a landing pad connected to one of the interconnection members. The interconnection members are disposed to overlap with the trenches, respectively. Each of the interconnection members includes a pillar portion, and a protrusion portion extending from an end of the pillar portion to have a hemispherical shape, wherein the protrusion portion is connected to one of the wiring patterns. Each of the interconnection members includes copper. The semiconductor chip and the elastic buffer layer are covered with a molding member. A space between the elastic buffer layer and the substrate is filled with a flexible molding member. The flexible molding member includes one or more of silicone resin and silicone rubber.

According to another embodiment, there is provided a semiconductor device. The semiconductor device includes a semiconductor chip having a first surface and a second surface opposite to the first surface, a substrate disposed on the first surface of the semiconductor chip, and an insulation layer disposed between the semiconductor chip and the substrate. The insulation layer includes trenches disposed therein, and the trenches have a predetermined depth. An elastic buffer layer is disposed between the insulation layer and the substrate. Lower wiring patterns are disposed in the elastic buffer layer. Each of the lower wiring patterns includes a landing pad aligned with any one of the trenches. Interconnection members are disposed to electrically connect the landing pads to the substrate. Each of the interconnection members has one end electrically connected to one of the landing pads and the other end electrically connected to the substrate.

According to another embodiment, there is provided a semiconductor device. The semiconductor device includes a first substrate and a second substrate. The second substrate is disposed over the first substrate, and the second substrate includes a first surface and a second surface opposite to the first surface. A trench is disposed in the second substrate to be adjacent to the second surface. An elastic buffer layer is disposed on the second surface of the second substrate, and the elastic buffer layer has an opening disposed on its surface facing the first substrate. A lower wiring pattern is disposed inside the elastic buffer layer, and the lower wiring pattern includes a landing pad disposed to be aligned to the trench. An interconnection member is disposed to electrically connect the first substrate to the second substrate. One end of the interconnection member is connected to the lower wiring pattern, and the other end is connected to the first substrate.

The second substrate further includes an outer circuit wiring pattern disposed on the first surface and a via electrode penetrating the second substrate from the first surface to the second surface, wherein one of both ends of the via electrode is connected to the outer circuit wiring pattern and the other end is connected to the lower wiring pattern. The elastic buffer layer is disposed to cover the opened portion of the upper portion of the trench on the second surface of the second substrate, and wherein the landing pad is disposed on the elastic buffer layer. The trench is disposed to have a predetermined depth from the second surface of the second substrate, and the elastic buffer layer is disposed to cover the opened portion of the upper portion of the trench, and a cavity is disposed between the trench and the elastic buffer layer. The second substrate includes a substrate core comprising a first insulation material having a Young's modulus of 20 GPa to 40 GPa, and the elastic buffer layer includes a second insulation material having a Young's modulus of 0.01 GPa to 0.1 GPa so as to be warped or bent by an external force. The first insulation material includes one or more of glass fiber, epoxy resin and inorganic filler. The second insulation material includes one or more of silicone resin and silicone rubber. The second substrate includes a plurality of trenches disposed to be spaced apart from each other on the second surface, wherein the second surface is in contact with the elastic buffer layer. The remaining portion of the lower wiring pattern except the landing pad is covered with the elastic buffer layer. The landing pad is disposed at a position spaced apart from the bottom surface by a predetermined distance. The lower wiring pattern further includes a conductive pattern extending in at least one direction from the landing pad and connected to the via electrode, wherein the lower wiring pattern has a curve line shape. The conductive pattern has a sine wave shape. The lower wiring pattern further includes a conductive pattern extending to a first direction from the landing pad and connected to the via electrode, and an extended conductive pattern extending to a second direction opposite to the first direction and further extending to outside of the side wall of the trench, wherein the conductive pattern has a curved line shape. The interconnection member is disposed to be aligned with the trench. The interconnection member includes a pillar portion, and a protrusion portion connected to the lower wiring pattern and having a hemispherical shape. The protrusion portion of the interconnection member includes a solder material.

According to another embodiment, there is provided a memory card including a semiconductor device. The semiconductor package includes a substrate, an elastic buffer layer disposed on a surface of the substrate, wiring patterns disposed on a surface of the elastic buffer layer, and a semiconductor chip disposed on another surface of the elastic buffer layer opposite to the substrate. The semiconductor chip includes trenches disposed therein. Interconnection members are disposed to electrically connect the elastic buffer layer to the substrate. Each of the interconnection members has one end electrically connected to one of the wiring patterns and the other end electrically connected to the substrate.

According to another embodiment, there is provided a memory card including a semiconductor device. The semiconductor device includes a semiconductor chip having a first surface and a second surface opposite to the first surface, a substrate disposed on the first surface of the semiconductor chip, and an insulation layer disposed between the semiconductor chip and the substrate. The insulation layer includes trenches disposed therein, and the trenches have a predetermined depth. An elastic buffer layer is disposed between the insulation layer and the substrate. Lower wiring patterns are disposed in the elastic buffer layer. Each of the lower wiring patterns includes a landing pad aligned with any one of the trenches. Interconnection members are disposed to electrically connect the landing pads to the substrate. Each of the interconnection members has one end electrically connected to one of the landing pads and the other end electrically connected to the substrate.

According to another embodiment, there is provided a memory card including a semiconductor device. The semiconductor device includes a first substrate and a second substrate. The second substrate is disposed over the first substrate, and the second substrate includes a first surface and a second surface opposite to the first surface. A trench is disposed in the second substrate to be adjacent to the second surface. An elastic buffer layer is disposed on the second surface of the second substrate, and the elastic buffer layer has an opening disposed on its surface facing the first substrate. A lower wiring pattern is disposed inside the elastic buffer layer, and the lower wiring pattern includes a landing pad disposed to be aligned to the trench. An interconnection member is disposed to electrically connect the first substrate to the second substrate. One end of the interconnection member is connected to the lower wiring pattern, and the other end is connected to the first substrate.

According to another embodiment, there is provided an electronic system including a semiconductor device. The semiconductor device includes a substrate, an elastic buffer layer disposed on a surface of the substrate, wiring patterns disposed on a surface of the elastic buffer layer, and a semiconductor chip disposed on another surface of the elastic buffer layer opposite to the substrate. The semiconductor chip includes trenches disposed therein. Interconnection members are disposed to electrically connect the elastic buffer layer to the substrate. Each of the interconnection members has one end electrically connected to one of the wiring patterns and the other end electrically connected to the substrate.

According to another embodiment, there is provided an electronic system including a semiconductor package. The semiconductor package includes a semiconductor chip having a first surface and a second surface opposite to the first surface, a substrate disposed on the first surface of the semiconductor chip, and an insulation layer disposed between the semiconductor chip and the substrate. The insulation layer includes trenches disposed therein, and the trenches have a predetermined depth. An elastic buffer layer is disposed between the insulation layer and the substrate. Lower wiring patterns are disposed in the elastic buffer layer. Each of the lower wiring patterns includes a landing pad aligned with any one of the trenches. Interconnection members are disposed to electrically connect the landing pads to the substrate. Each of the interconnection members has one end electrically connected to one of the landing pads and the other end electrically connected to the substrate.

According to another embodiment, there is provided an electronic system including a semiconductor device. The semiconductor device includes a first substrate and a second substrate. The second substrate is disposed over the first substrate, and the second substrate includes a first surface and a second surface opposite to the first surface. A trench is disposed in the second substrate to be adjacent to the second surface. An elastic buffer layer is disposed on the second surface of the second substrate, and the elastic buffer layer has an opening disposed on its surface facing the first substrate. A lower wiring pattern is disposed inside the elastic buffer layer, and the lower wiring pattern includes a landing pad disposed to be aligned to the trench. An interconnection member is disposed to electrically connect the first substrate to the second substrate. One end of the interconnection member is connected to the lower wiring pattern, and the other end is connected to the first substrate.

BRIEF DESCRIPTION OF THE DRAWINGS

Embodiments of the present disclosure will become more apparent in view of the attached drawings and accompanying detailed description, in which.

DETAILED DESCRIPTION

Various embodiments will now be described hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the present disclosure to those skilled in the art.

Same reference numerals refer to same elements throughout the specification. Thus, even though a reference numeral is not mentioned or described with reference to a drawing, the reference numeral may be mentioned or described with reference to another drawing. In addition, even though the reference numerals are not shown in a drawing, it may be mentioned or described with reference to another drawing.

Figure 1:
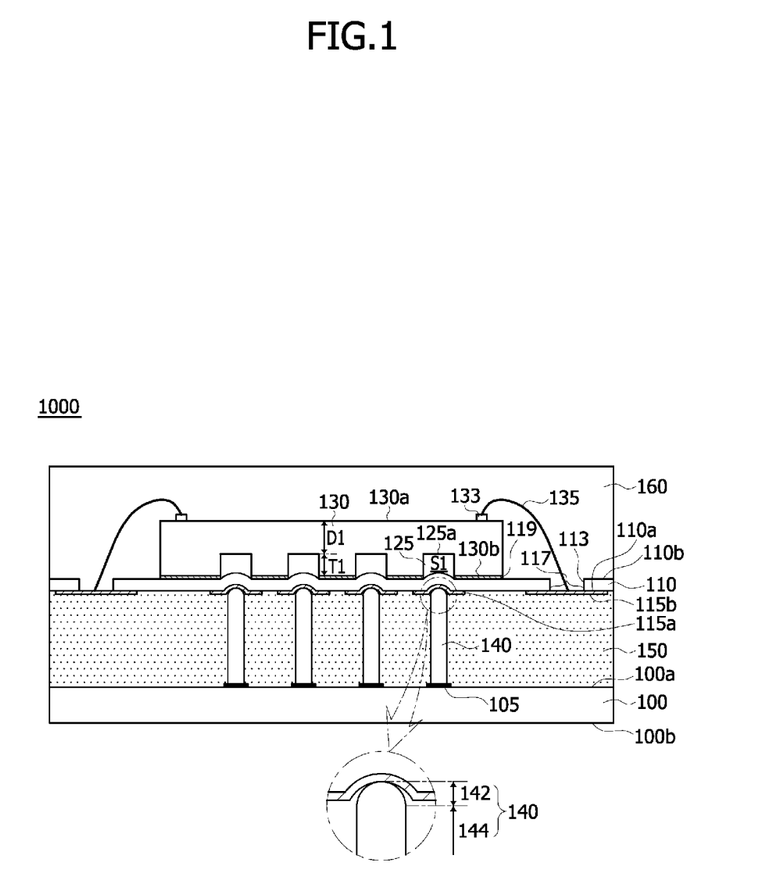
FIG. 1 is a cross-sectional view illustrating a semiconductor device according to an embodiment.
Figure 2:
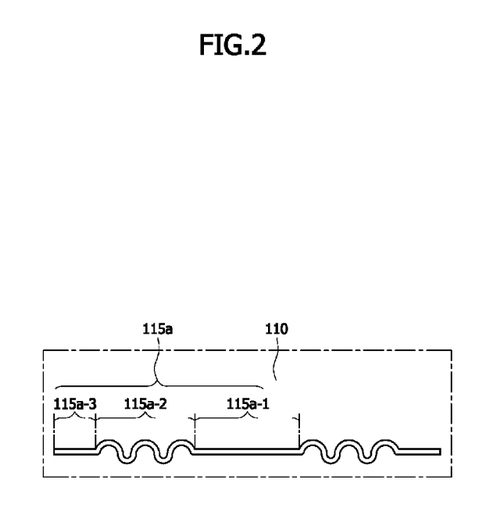
FIG. 2 is a bottom view illustrating a wiring pattern of FIG. 1.
Figure 3:
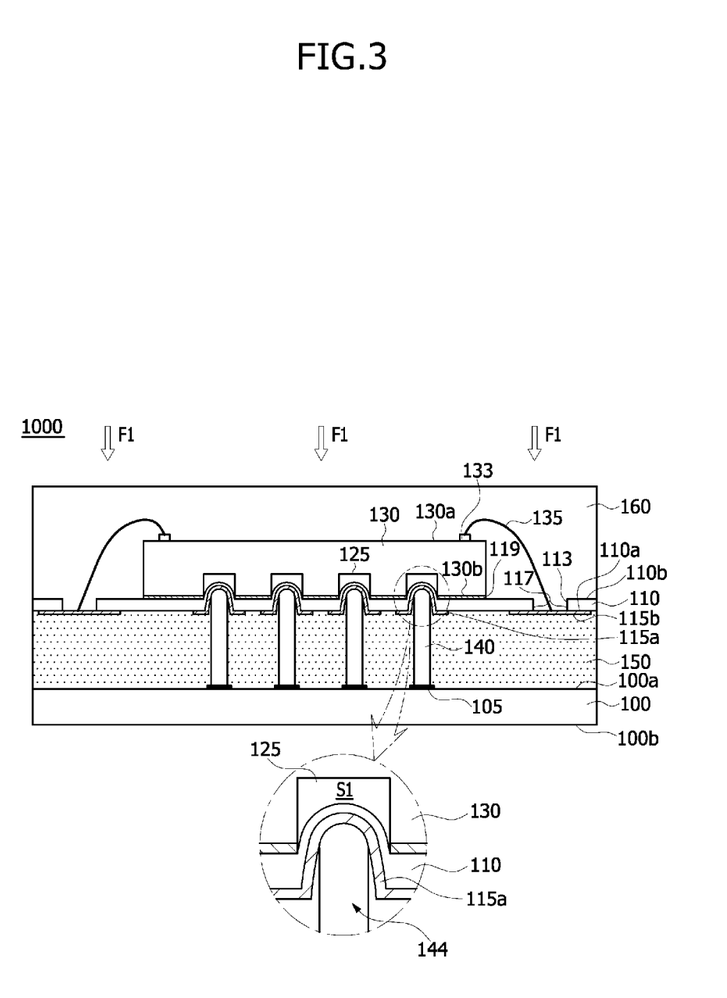
FIG. 3 is a cross-sectional view illustrating how to alleviate the stress applied to a semiconductor device according to an embodiment.

FIG. 1 is a cross-sectional view illustrating a semiconductor device 1000 according to an embodiment. FIG. 2 is a bottom view illustrating a wiring pattern of FIG. 1. FIG. 3 is a cross-sectional view illustrating how to alleviate the stress applied to the semiconductor device according to an embodiment.

Referring to FIGS. 1 and 2, the semiconductor device 1000 according to an embodiment may include a substrate 100, an elastic buffer layer 110, a semiconductor chip 130 in which trenches 125 are formed, and interconnection members 140 connecting the substrate 100 to the semiconductor chip 130.

The substrate 100 may include a body and may be a plate-type member including a first surface 100a and a second surface 100b, which face away from each other. A plurality of substrate pads 105 may be arranged to be spaced apart from each other on the first surface 100a of the substrate 100. The substrate pad 105 may include, for example, aluminum (Al) or copper (Cu). The substrate 100 may include, for example, a printed circuit board (hereinafter referred to as "PCB"), an organic substrate or an insulation substrate. If the substrate 100 is the PCB, the substrate 100 may include a rigid type PCB. Although not illustrated in the drawing, wiring patterns may be disposed in the body of the substrate 100. Also, an insulation layer (not illustrated) may be disposed on the first surface 100a or the second surface 100b except a portion where the substrate pads 105 are exposed. The insulation layer may include a solder resist material.

The elastic buffer layer 110 may be disposed on the first surface 100a of the substrate 100. The elastic buffer layer 110 may include a first surface 110a and a second surface 110b, which face away from each other. A body of the elastic buffer layer 110 may include a thin film composed of an insulation material. The insulation material may include a material having elasticity so that the semiconductor device 1000 can be warped or bent without damaging its functionality when an external force is applied to the semiconductor device 1000. More specifically, the insulation material of the elastic buffer layer 110 may include a material having a tensile modulus of elasticity of about 0.01 GPa to about 0.1 GPa. In an embodiment, the insulation material of the elastic buffer layer 110 may include, for example, silicone resin or silicone rubber.

Wiring patterns 115a and 115b may be disposed on the first surface 110a of the elastic buffer layer 110. The wiring patterns 115a and 115b may include first wiring patterns 115a and second wiring patterns 115b. The first wiring patterns 115a may be connected to the interconnection members 140, respectively.

Referring to FIG. 2 illustrating one of the first wiring patterns 115a of FIG. 1, each of the first wiring patterns 115a may include a first portion 115a-1, a couple of second portions 115a-2 and a couple of third portions 115a-3. The first portion 115a-1 and the third portions 115a-3 may have a fixed form. whereas the second portions 115a-2 may have a flexible form such as a curved line shape. In an embodiment, the first portion 115a-1 and the third portion 115a-3 may have a straight line form and the second portion 115a-2 may have a wave shape such as a sine wave shape. The first portion 115a-1 of the first wiring pattern 115a may be disposed to overlap with the trench 125 formed in the semiconductor chip 130 and to contact the interconnection member 140. The second portions 115a-2 and the third portions 115a-3 of the first wiring pattern 115a may be disposed to extend from the first portion 115a-1. More specifically, the couple of second portions 115a-2 may be respectively disposed to extend from both ends of the first portion 115a-1, and the couple of third portions 115a-3 may be respectively disposed to extend from ends of the couple of second portions 115a-2. Accordingly, the first portion 115a-1 of the first wiring pattern 115a may act as a landing pad which is in contact with the interconnection member 140. The elastic buffer layer 110 may further include openings 113 that expose at least a part of the second wiring patterns 115b. The second wiring patterns 115b exposed by the opening 113 may correspond to connection pads 117 connected to metal wires 135. The first wiring patterns 115a and the second wiring patterns 115b may include, for example, aluminum (Al) or copper (Cu).

The semiconductor chip 130 may be disposed on the second surface 110b of the elastic buffer layer 110. The semiconductor chip 130 may be bonded to the elastic buffer layer 110 via an adhesive member 119. The adhesive member 119 may include, for example, an adhesives or an adhesive tape such as a die attach film (hereinafter referred to as "DAF").

Active elements such as transistors may be disposed in the semiconductor chip 130. In some cases, passive elements such as capacitors and/or resistors may also be disposed in the semiconductor chip 130. The semiconductor chip 130 may include an active surface such as a front-side portion 130a in which active regions exist, and the other surface such as a back-side portion 130b which faces away from the front-side portion 130a. The semiconductor chip 130 may be disposed on the elastic buffer layer 110 so that the back-side portion 130b of the semiconductor chip 130 faces the elastic buffer layer 110. A plurality of chip pads 133 may be disposed on the front-side portion 130a of the semiconductor chip 130. Although FIG. 1 illustrates an example in which the chip pads 133 are disposed on both edges of the semiconductor chip 130, but the present disclosure is not limited thereto. For example, although not illustrated in the drawing, the chip pads 133 may be disposed on the central portion of the semiconductor chip 130. The chip pad 133 may include, for example, aluminum (Al) or copper (Cu).

The plurality of trenches 125 may be disposed to be spaced apart from each other in the back-side portion 130b of the semiconductor chip 130. Each of the trenches 125 may have a depth corresponding to a first depth T1, which is a distance from a surface of the back-side portion 130b to a bottom surface 125a. The trenches 125 may be disposed to be spaced apart from the front-side portion 130a of the semiconductor chip 130 by at least a first distance D1. The trenches 125 may be disposed to vertically overlap with the first wiring patterns 115a, respectively. In an embodiment, the trenches 125 may be disposed to be spaced apart from each other in the back-side portion 130b of the semiconductor chip 130. The trenches 125 may be covered with the elastic buffer layer 110. Accordingly, a cavity S1 may be formed between the bottom surface 125a of each trench 125 and the elastic buffer layer 110.

Although FIG. 1 illustrates an example in which four trenches 125 are disposed in the back-side portion 130b of the semiconductor chip 130, but the present disclosure is not limited thereto. The number and depth of the trenches 125 may be set to be different according to various embodiments.

The semiconductor chip 130 and the elastic buffer layer 110 may be connected to each other through the metal wires 135. The metal wires 135 may electrically connect the second wiring patterns 115b to the semiconductor chip 130. One end of each metal wire 135 may be bonded to one of the chip pads 133 disposed on the front-side portion 130a of the semiconductor chip 130, and the other end of each metal wire 135 may be bonded to one of the connection pads 117 of the elastic buffer layer 110. The metal wire 135 may include, for example, gold (Au), silver (Ag), or copper (Cu). A molding member 160 may be disposed on the front-side portion 130a of the semiconductor chip 130. The molding member 160 may be disposed to cover the second surface 110b of the elastic buffer layer 110, exposed portions of the connection pads 117, and sidewalls of the semiconductor chip 130. The molding member 160 may include an insulating material having a tensile elasticity modulus which is higher than that of the elastic buffer layer 110. In an embodiment, the molding member 160 may include epoxy molding compound (hereinafter referred to as "EMC"). The molding member 160 may physically and chemically protect the semiconductor chip 130 from the external environment.

The interconnection members 140 may connect the semiconductor chip 130 to the substrate 100 through the elastic buffer layer 110, and each of the interconnection members 140 may have a pillar shape which is perpendicular to the first surface 100a of the substrate 100. In an embodiment, the interconnection member 140 may include copper (Cu). One end of each interconnection member 140 may be connected to one of the first wiring patterns 115a of the elastic buffer layer 110 and the other end of each interconnection member 140 may be connected to one of the substrate pads 105 of the substrate 100. The interconnection members 140 may be disposed to vertically overlap with the trenches 125, respectively. Referring to an enlarged section of FIG. 1, each of the interconnection members 140 may include a pillar 144 and a protrusion 142 extending from an end of the pillar 144. The protrusion 142 may be connected to the first wiring pattern 115a and may have a hemispherical shape. The protrusion 142 of the interconnection member 140 may be connected to the first portion 115a-1 of the first wiring pattern 115a shown in FIG. 2. That is, the protrusion 142 of the interconnection member 140 may be connected to any one of the landing pads.

A flexible molding member 150 may fill a space between the elastic buffer layer 110 and the substrate 100. The interconnection members 140 may be disposed in the space between the elastic buffer layer 110 and the substrate 100. Thus, the flexible molding member 150 may be disposed to surround the interconnection members 140. The flexible molding member 150 may include a flexible material which is capable of being bent when the external force is applied to the substrate 100. The flexible material may include silicone or rubber.

The trenches 125 formed in the back-side portion 130b of the semiconductor chip 130 may be disposed on a surface of the elastic buffer layer 110 which is an opposite side of the first wiring patterns 115a connected to the interconnection members 140. This structure may prevent the interconnection members 140 from being broken or separated from the substrate 100 or the first wiring pattern 115a when the semiconductor device 1000 is bent or warped. More specifically, as illustrated in FIG. 3, if the external force F1 is applied to the semiconductor 1000, for example, in a vertical direction, the elastic buffer layer 110 including an elastic material therein may be deformed or bent and the interconnection members 140 may move into the cavity S1 formed between the trench 125 and the elastic buffer layer 110. In other words, the trenches 125 may provide the cavities S1 into which the protrusions 142 of the interconnection members 140 are movable when the external force F1 is applied to the semiconductor 1000. Accordingly, even if the external force F1 is applied to the semiconductor device 1000, the electrical and mechanical connection between the interconnection members 140 and the elastic buffer layer 110 may still be maintained without deformation of the interconnection members 140.

If the external force F1 applied from the molding member 160 toward the substrate 100 causes the interconnection members 140 to move into the cavities S1 provided by the trenches 125, portions of the elastic buffer layer 110 may expand and move into the cavities S1, and a tensile stress may be applied to the elastic buffer layer 110. At the same time, the tensile stress may also be applied to the first wiring patterns 115a disposed on the first surface 110a of the elastic buffer layer 110, but the second portions 115a-2 of the first wiring patterns 115a having a curved line shape may be stretched and straightened. Thus, the first wiring patterns 115a may not be broken or separated from the elastic buffer layer 110. In addition, referring to FIG. 2, if the elastic buffer layer 110 is bent, a contact area between the protrusion 142 of the interconnection member 140 and the first portion 115a-1 of the first wiring pattern 115a increases to reduce the contact resistance therebetween while the electrical connection is maintained. Moreover, as the protrusion 142 of the interconnection member 140 has a hemispherical shape, at least a part of the contact area can be maintained during the first portion 115a-1 of the first wiring pattern 115a is deformed by an external pressure or tensile force.

Figure 4:
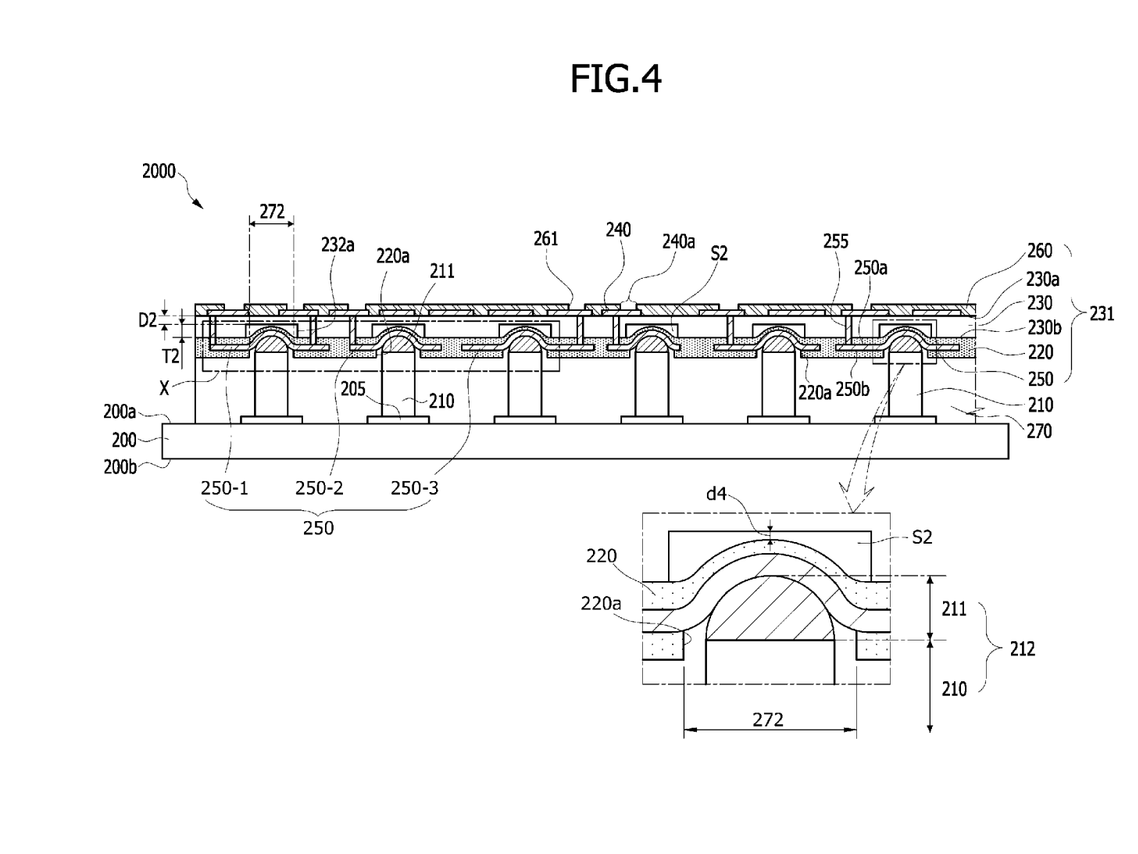
FIG. 4 is a cross-sectional view illustrating a semiconductor device according to an embodiment.
Figure 5:
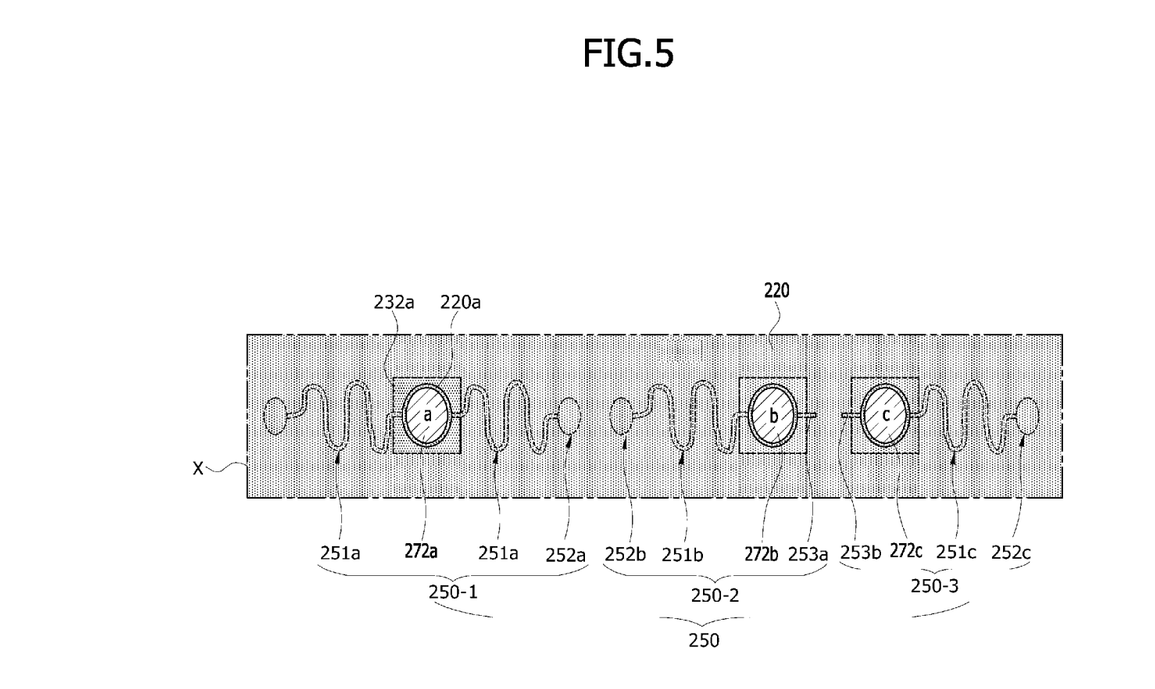
FIG. 5 is a bottom view illustrating a portion 'X' of FIG. 4.

FIG. 4 is a cross-sectional view illustrating a semiconductor device 2000 according to an embodiment. FIG. 5 is a bottom-plan view of a lower wiring pattern 250 of FIG. 4.

Referring to FIG. 4, the semiconductor device 2000 may include a first substrate 200, a second substrate 231 in which trenches 232a are disposed, and interconnection members 212. The semiconductor device 2000 may further include an elastic bonding member 270.

The first substrate 200 may be a plate-type member including a first surface 200a and a second surface 200b facing away from each other. A plurality of substrate pads 205 may be disposed to be spaced apart from each other on the first surface 200a of the first substrate 200. The first substrate 200 may include an insulation material layer or a dielectric material layer. The first substrate 200 may be a PCB structure. Although not illustrated in the drawings, inner wiring patterns may be disposed in a body of the first substrate 200.

The second substrate 231 may be disposed on the first surface 200a of the first substrate 200. The second substrate 231 may include a substrate core 230, outer circuit wiring patterns 240, an outer insulation layer 260, an elastic buffer layer 220 in which lower wiring patterns 250 are disposed, and via electrodes 255. The substrate core 230 may be formed by laminating an organic insulation material and a metal conductor in order to mount a semiconductor chip, a semiconductor package, another substrate, or the like thereon. The substrate core 230 may include an insulation material having a relatively high Young's modulus. More specifically, the substrate core 230 may include an insulation material having a Young's modulus of about 20 GPa to about 40 GPa. In an embodiment, the substrate core 230 may include, for example, glass fiber, epoxy resin, inorganic filler, or the like. Accordingly, a deformation of the substrate core 230 may be minimized even if an external force is applied to the substrate core 230.

The substrate core 230 may include a first surface 230a and a second surface 230b facing away from each other. The plurality of trenches 232a may be disposed to be adjacent to the second surface 230b of the substrate core 230. The trenches 232a may be recessed by a predetermined depth from the second surface 230b of the substrate core 230 and may be spaced apart from each other by a predetermined distance. Each of the trenches 232a may be disposed to have a second depth T2 from the second surface 230b. Bottom surfaces of the trenches 232a may be spaced apart from the first surface 230a of the substrate core 230 by a predetermined distance D2. The semiconductor device 2000 may also include cavities S2 formed between the bottom surfaces of the trenches 232a and the elastic buffer layer 220. The cavities S2 may provide spaces into which the interconnection members 212 can move while the elastic buffer layer 220 is deformed because of the external force applied to the semiconductor device 2000. Accordingly, even if the semiconductor device 2000 is deformed by the external force, the interconnection members 212 may maintain their electrical connections. In another embodiment, the trenches 232a may be through-holes that penetrate from the first surface 230a to the second surface 230b of the substrate core 230.

The outer circuit wiring patterns 240 may be disposed on the first surface 230a of the substrate core 230. The outer circuit wiring patterns 240 may be electrically insulated from each other. In other regions, however, the outer circuit wiring patterns 240 may be electrically connected to each other. The outer insulation layer 260 may be disposed on the first surface 230a of the substrate core 230. In an embodiment, the outer insulation layer 260 may include a solder resist material. The outer insulation layer 260 may have a plurality of first openings 261. Portions of the upper surfaces of the outer circuit wiring patterns 240 may be exposed by the first openings 261 of the outer insulation layer 260, and the exposed portions of the outer circuit wiring patterns 240 may act as bonding pads 240a. The outer wiring patterns 240 may be electrically connected to the via electrodes 255. Each of the via electrodes 255 may be disposed to penetrate from the first surface 230a of the substrate core 230 to the second surface 230b of the substrate core 230. In an embodiment, each via electrode 255 may include an extension that protrudes from the second surface 230b of the substrate core 230 by a predetermined height.

One end of each via electrode 255 may be electrically connected to a bottom surface of one of the outer wiring patterns 240, and the other end of each via electrode 255 may be electrically connected to an upper surface of one of the lower wiring patterns 250. The lower wiring patterns 250 may be disposed in the elastic buffer layer 220. The elastic buffer layer 220 may be disposed on the second surface 230b of the substrate core 230. The elastic buffer layer 220 may be disposed to surround sidewalls of the extensions of the via electrodes 255. The elastic buffer layer 220 may include a thin film comprising an insulation material. The elastic buffer layer 220 may include a flexible insulation material that can be warped or bent when the external force is physically applied to the elastic buffer layer 220. The flexible insulation material of the elastic buffer layer 220 may include a material having a Young's modulus which is lower than that of the substrate core 230. For example, the flexible insulation material of the elastic buffer layer 220 may have a Young's modulus of about 0.01 GPa to about 0.1 GPa. In an embodiment, the flexible material may include, for example, silicone resin or silicone rubber.

The lower wiring patterns 250 having elasticity may be disposed in the elastic buffer layer 220. Upper surfaces 250a of the lower wiring patterns 250 may contact the bottom surfaces of the via electrodes 255, respectively. Thus, the lower wiring patterns 250 may be electrically connected to the via electrodes 255, respectively. The elastic buffer layer 220 may include openings 220a that expose at least a part of each of bottom surfaces 250b of the lower wiring patterns 250. The openings 220a may be formed by etching the elastic buffer layer 220 by a predetermined depth from the bottom surface of the elastic buffer layer 220. Portions of the lower wiring patterns 250 exposed by the openings 220a may correspond to landing pads 272. The elastic buffer layer 220 may be disposed across the trenches 232a in a plan view. In other words, the trenches 232a may be covered with the elastic buffer layer 220. Thus, cavities S2 may be formed in the trenches 232a. The landing pads 272 may be disposed under the trenches 232a. That is, the landing pads 272 may be disposed to vertically overlap with the trenches 232a. Accordingly, each of the landing pads 272 is not directly supported by the substrate core 230, but may be spaced apart from the bottom surface of the trench 232 by a predetermined distance d4.

FIG. 5 is a bottom-plan view illustrating a region 'X' of FIG. 4. Referring to FIG. 5, the lower wiring patterns 250 may include a plurality of lower wiring patterns 250-1, 250-2 and 250-3. The lower wiring pattern 250-1 may include a first landing pad 272a corresponding to one of the landing pads (e.g., 272 of FIG. 4) and a couple of first conductive patterns 251a extending from both ends of the first landing pad 272a in two opposite directions. The lower wiring pattern 250-2 may include a second landing pad 272b and a second conductive pattern 251b extending from one end of the second landing pad 272b in one direction. The lower wiring pattern 250-3 may include a third landing pad 272c and a third conductive pattern 251c extending from one end of the third landing pad 272c in one direction. Also, the lower wiring pattern 250-2 may further include a first extended conductive pattern 253a extending from the other end of the second landing pad 272b in an opposite direction to the second conductive pattern 251b. The first extended conductive pattern 253a may extend up to an outside region of the trench 232a overlapping with the second landing pad 272b. In addition, the lower wiring pattern 250-3 may further include a second extended conductive pattern 253b extending from the other end of the third landing pad 272c in an opposite direction to the third conductive pattern 251c. The second extended conductive pattern 253b may extend up to an outside region of the trench 232a overlapping with the third landing pad 272c. The first and second extended conductive patterns 253a and 253b may reduce the probability that unbalanced displacement is generated only in one direction when landing pads 272b and 272c are deformed by an external force. The first landing pad 272a, the second landing pad 272b and the third landing pad 272c may respectively include contact portions a, b and c, each of which is in contact with one of the interconnection members 212.

Each of the first to third conductive patterns 251a, 251b and 251c may include a curved line extending in a direction. In an embodiment, the curved line may have a wave shape. For example, the curved line may have a sine wave shape. The sine wave shape may include at least two ridges and at least two gullies. The first to third conductive patterns 251a, 251b and 251c may respectively include contact points 252a, 252b and 252c, each of which contacts any one of the via electrodes (e.g., 255 of FIG. 4). The contact points 252a, 252b and 252c may correspond to ends of the first to third conductive patterns 251a, 251b and 251c. The landing pads 272a, 272b and 272c may be exposed by the openings 220a, and the remaining portions of the conductive patterns 251a, 251b and 251c may be covered with the elastic buffer layer 220. In an embodiment, the openings 220a may be smaller than the landing pads 272a, 272b and 272c. In such a case, the openings 220a may expose portions of the landing pads 272a, 272b and 272c to form a solder mask defined (hereinafter referred to as "SMD") land pattern structure. In another embodiment, the openings 232a may be bigger than the landing pads 272a, 272b and 272c. In such a case, the openings 220a may expose full surface of the landing pad to form a non-solder mask defined (hereinafter referred to as "NSMD") land pattern structure. Although not illustrated, the lower wiring patterns 250 may be disposed to connect the adjacent via electrodes to each other. In such a case, the lower wiring patterns 250 may not be connected to the landing pads 272. The lower wiring pattern 250 may include, for example, aluminum (Al) or copper (Cu).

If an external force is applied to the semiconductor device 2000 so that the second substrate 231 is pressed down toward the first substrate 200, the elastic buffer layer 220 supporting the landing pads 272 may be bent and each of the interconnection members 212 may move into the cavity S2 disposed between the trench 232a and the elastic buffer layer 220. In such a case, the sine-wave structures of the first conductive pattern 251a, the second conductive pattern 251b and the third conductive pattern 251c are stretched in the longitudinal direction. Thus, the conductive patterns may not be broken or detached from the elastic buffer layer 220. In addition, if each of the interconnection members 212 moves into the cavity S2, a contact area between the landing pad 272 and an end 211 of the interconnection member 212 may increase to reduce the contact resistance therebetween while the electrical connection is maintained.

Referring again to FIG. 4, the interconnection members 212 may be in contact with the landing pads 272 to electrically connect the first substrate 200 to the second substrate 231. The interconnection members 212 may be disposed to overlap with the trenches 232a, respectively. Each of the interconnection members 212 may have a vertical pillar shape. Each of the interconnection members 212 may include a pillar portion 210 and a protrusion portion 211 that extends from the pillar portion 210 to have a hemispherical shape. In an embodiment, the interconnection member 212 may include copper (Cu), but the present disclosure in not limited thereto. For example, each of the protrusion portions 211 disposed on end portions of the interconnection members 212 may include a solder material. In this case, the protrusion portions 211 may be directly bonded to the landing pads 272, respectively. On the other hand, the protrusion portions 211 may include a material such as copper (Cu) to be detachable from the landing pads 272.

The other ends of the interconnection members 212 opposite to the protrusion portions 211 may be connected to the substrate pads 205 of the first substrate 200, respectively. An elastic adhesive member 270 may be disposed in the space between the elastic buffer layer 220 and the first substrate 200. The elastic adhesive member 270 may be disposed to cover all of the interconnection members 212, the substrate pads 205 and the first surface 200a of the first substrate 200. In an embodiment, the elastic adhesive member 270 may be disposed to fix the elastic buffer layer 220 to a portion of the first substrate 200. For example, the elastic adhesive member 270 may be disposed to contact four edges of the first substrate 200.

Figure 6:
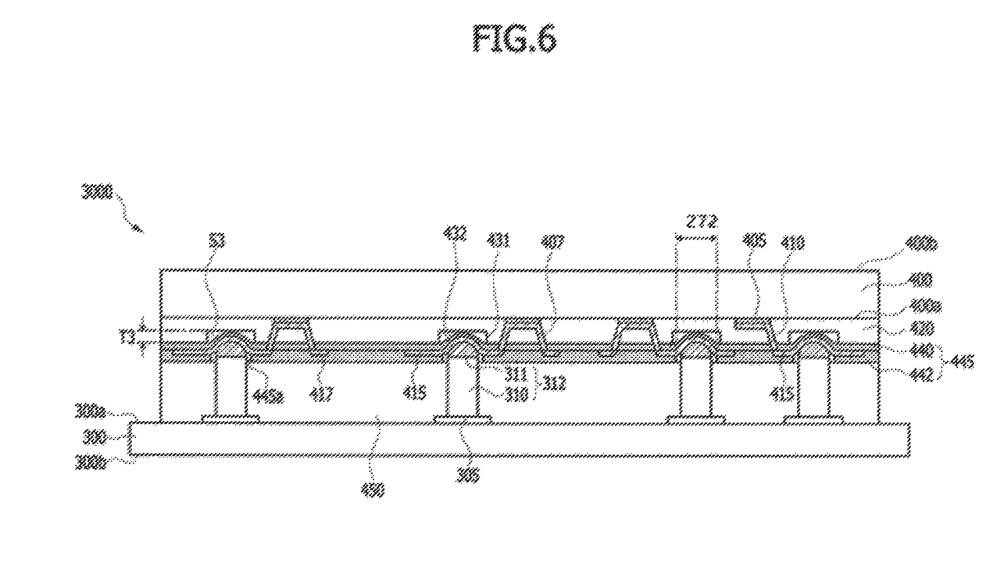
FIG. 6 is a cross-sectional view illustrating a semiconductor device according to an embodiment.

FIG. 6 is a cross-sectional view illustrating a semiconductor device 3000 according to an embodiment.

Referring to FIG. 6, the semiconductor device 3000 may include a substrate 300, a semiconductor chip 400, an insulating layer 420 including trenches 431, an elastic buffer layer 445 including lower wiring patterns 415, and interconnection members 312. The semiconductor device 3000 may further include an elastic adhesive member 450.

The substrate 300 may be a plate-type member including a first surface 300a and a second surface 300b facing away from each other. A plurality of substrate pads 305 may be disposed to be spaced apart from each other on the first surface 300a of the substrate 300. The substrate 300 may include an insulation material layer or a dielectric material layer. The substrate 300 may include a PCB structure. Although not illustrated in the drawings, inner wiring patterns may be disposed in a body of the substrate 300.

The semiconductor chip 400 may be disposed on the first surface 300a of the substrate 300. Although not illustrated in the drawings, active elements such as transistors may be disposed in the semiconductor chip 400. In some cases, passive elements such as capacitors and/or resistors may also be disposed in the semiconductor chip 400. The semiconductor chip 400 may be disposed on the substrate 300 so that an active surface of the semiconductor chip 400 faces the first surface 300a of the substrate 300. In an embodiment, the active surface of the semiconductor chip 400 may correspond to a surface of a front-side portion 400a of the semiconductor chip 400, and a surface of the semiconductor chip 400 facing opposite direction to the substrate 300 may correspond to a back-side portion 400b. Active regions may be disposed in the front-side portion 400a of the semiconductor chip 400. A plurality of chip pads 405 may be disposed on the front-side portion 400a of the semiconductor chip 400. Each of the chip pads 405 may include aluminum (Al) or copper (Cu).

The insulation layer 420 may be disposed on the front-side portion 400a of the semiconductor chip 400. A surface of the insulation layer 420 may be in contact with the front-side portion 400a of the semiconductor chip 400. In an embodiment, the insulation layer 420 may include at least one selected from the group consisting of benzocyclobutene (hereinafter referred to as "BCB") and polyimide. The BCB or polyimide may have a high Young's modulus of about 2.9 GPa to about 3.2 GPa. Accordingly, a probability that the insulation layer 420 is deformed by an external force may decrease.

The plurality of trenches 431 may be disposed in the insulation layer 420. The trenches 431 may be recessed by a predetermined depth from a surface of the insulation layer 420 opposite to semiconductor chip 400 and may be spaced apart from each other by a predetermined distance. Each of the trenches 431 may be disposed to have a third depth T3 from the surface of the insulation layer 420 opposite to semiconductor chip 400. In another embodiment, the trenches 431 may be through-holes penetrating the insulation layer 420.

First inner wiring patterns 407 electrically connected to the chip pads 405 of the semiconductor chip 400 may be disposed in the insulation layer 420. In an embodiment, the first inner wiring patterns 407 may extend to protrude such that the height of the first inner wiring patterns 407 is higher than a surface of the insulation layer 420 by a predetermined height. The elastic buffer layer 445 including extensions of the first inner wiring patterns 407 may be disposed on the surface of the insulation layer 420 facing away from the semiconductor chip 400. The elastic buffer layer 445 may have a multi-layer structure including a first elastic buffer layer 440 and a second elastic buffer layer 442 which are sequentially stacked on the insulation layer 420. The first elastic buffer layer 440 may be disposed to cover the surface of the insulation layer 420 facing away from the semiconductor chip 400. The first elastic buffer layer 440 may be disposed to cover the trenches 431. Accordingly, cavities S3 may be formed in the trenches 431.

If an external force is applied to the semiconductor device 3000 and the force is transmitted to the interconnection members 312 in the semiconductor chip 400, the pressure is transmitted to the landing pads 272 being in contact with the interconnection members 312. As a result, the elastic buffer layer 445 supporting the landing pads 272 may be bent and the interconnection members 312 may be inserted into the cavities S3.

The first elastic buffer layer 440 and/or the second elastic buffer layer 442 may include a flexible insulation material that is capable of being warped or bent when the external force is physically applied thereto. The flexible insulation material may include a material having a Young's modulus which is lower than that of the insulation layer 420. For example, the flexible insulation material may have a Young's modulus of about 0.01 GPa to about 0.1 GPa. In an embodiment, the flexible insulation material may include silicone resin or silicone rubber.

The lower wiring patterns 415 and second inner wiring patterns 417 may be disposed on the first elastic buffer layer 440. Each of the lower wiring patterns 415 may be electrically connected to one end of any one of the first inner wiring patterns 407, and each of the second inner wiring patterns 417 may be electrically connected to the other end of the first inner wiring pattern 407. Each of the lower wiring patterns 415 may have the same configuration as any one of the lower wiring patterns described with reference to FIG. 5. For example, each of the lower wiring patterns 415 may have a curved line extending in a direction, and the curved line may have a wave shape such as a sine wave shape. Each of the lower wiring patterns 415 may include aluminum (Al) and copper (Cu).

The second elastic buffer layer 442 covering the lower wiring patterns 445 and the second inner wiring patterns 417 may be disposed on a surface of the first elastic buffer layer 440 which is an opposite side to the insulation layer 420. The second elastic buffer layer 442 may include openings 445a that partially expose the bottom surface of the lower wiring patterns 415. The openings 445a may be formed by etching the bottom surface of the second elastic buffer layer 442 by a predetermined depth. The portions of the lower wiring patterns 415 exposed by the openings 445a may be landing pads 272.

The interconnection members 312 may be in contact with the landing pads 272 to electrically connect the substrate 300 to the semiconductor chip 400. The interconnection members 312 may be disposed to overlap with the landing pads 272 and the trenches 431. Each of the interconnection members 312 may have a vertical pillar shape. Each of the interconnection members 312 may include a pillar portion 310 and a protrusion portion 311 extending from one end of the pillar portion 310 and having a hemispherical shape. In an embodiment, the interconnection member 312 may include copper (Cu), but the present disclosure is not limited thereto. For example, the protrusion portion 311 located on the end of the interconnection member 312 may include a solder material. In an embodiment, the protrusion portion 311 including solder may be bonded to the landing pad 272.

The other end of each interconnection member 312 may be bonded to any one of the substrate pads 305 of the substrate 300. The elastic adhesive member 450 may be disposed in a space between the elastic buffer layer 445 and the substrate 300. The elastic adhesive member 450 may be disposed to fully cover the interconnection members 312, the substrate pads 305, and the first surface 300a of the substrate 300. In an embodiment, the elastic adhesive member 450 may be disposed to fix the elastic buffer layer 445 to a portion of the substrate 300. For example, the elastic adhesive member 450 may be disposed to contact four edges of the substrate 300.

Figure 7:
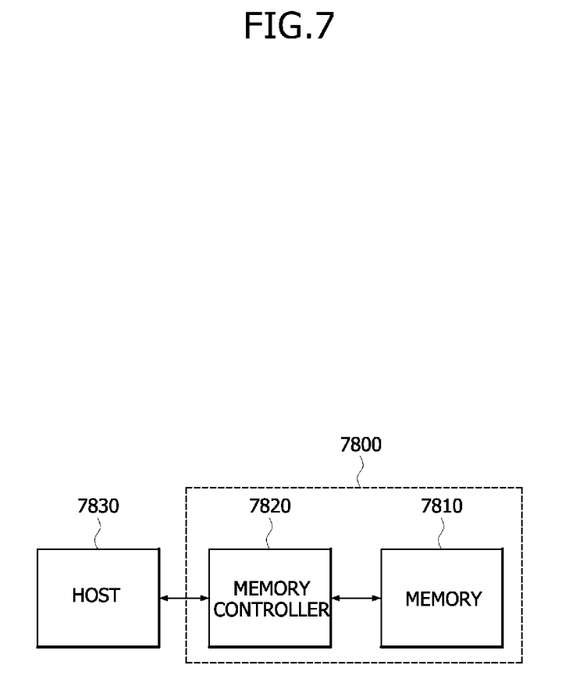
FIG. 7 is a block diagram illustrating an electronic system employing a memory card including a package in accordance with an embodiment.

FIG. 7 is a block diagram illustrating an example of an electronic system including a memory card 7800 including at least one semiconductor device according to an embodiment. The memory card 1800 may include a memory 7810, such as a nonvolatile memory device, and a memory controller 7820. The memory 7810 and the memory controller 7820 may store data or read stored data. The memory 7810 and/or the memory controller 7820 may include one or more semiconductor chips disposed in an embedded package according to an embodiment.

The memory 7810 may include a nonvolatile memory device to which the technology of the embodiments of the present invention is applied. The memory controller 7820 may control the memory 7810 such that stored data is read out or data is stored in response to a read/write request from a host 7830.

Figure 8:
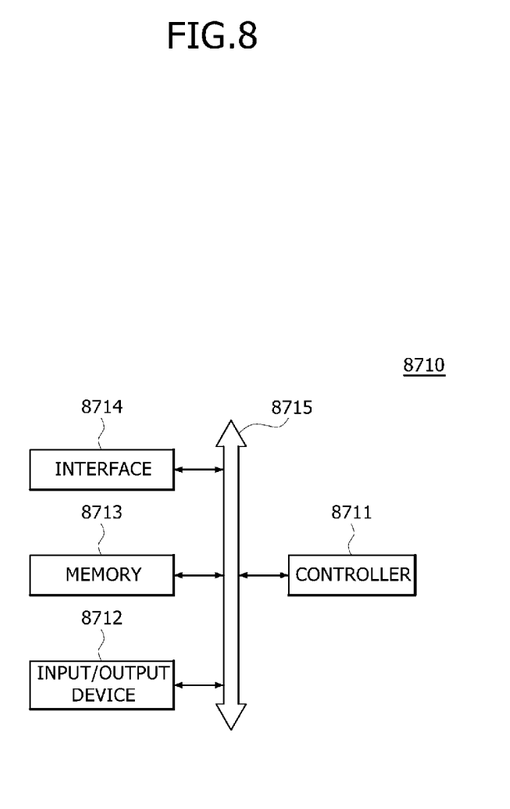
FIG. 8 is a block diagram illustrating an electronic system including a package in accordance with an embodiment.

FIG. 8 is a block diagram illustrating an example of an electronic system 8710 including at least one device according to an embodiment. The electronic system 8710 may include a controller 8711, an input/output device 8712, and a memory 8713. The controller 8711, the input/output device 8712 and the memory 8713 may be coupled to one another through a bus 8715 for data transmission.

In an embodiment, the controller 8711 may include one or more of microprocessor, digital signal processor, microcontroller, and/or logic device capable of performing the same functions as these components. The controller 8711 or the memory 8713 may include one or more of the semiconductor packages according to embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk ("SSD"). In this case, the electronic system 8710 may stably store a large amount of data in a flash memory system.

The electronic system 8710 may further include an interface 8714 for transmitting and receiving data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant ("PDA"), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as of Code Division Multiple Access ("CDMA"), Global System for Mobile communications ("GSM"), North American Digital Cellular ("NADC"), Enhanced-Time Division Multiple Access ("E-TDMA"), Wideband Code Division Multiple Access ("WCDAM"), CDMA2000, Long Term Evolution ("LTE") and Wireless Broadband Internet ("Wibro").

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
   a substrate having a first surface and a second surface facing away from the first surface;
   an elastic buffer layer disposed over the first surface of the substrate;
   wiring patterns disposed on a first surface of the elastic buffer layer;
   a semiconductor chip disposed on a second surface of the elastic buffer layer facing away from the first surface of the elastic buffer layer, wherein the semiconductor chip includes trenches formed on a surface facing the elastic buffer layer, wherein the elastic buffer layer crosses each trench to provide a respective cavity; and
   interconnection members electrically connecting the wiring patterns to the substrate,
   wherein each of the interconnection members has one end electrically connected to one of the wiring patterns and the other end electrically connected to the substrate.

2. A semiconductor package comprising:
   a semiconductor chip (400) having a front-side portion (400a) and a back-side portion (400b) facing away from the front-side portion ;
   a substrate (300) disposed under the front-side portion of the semiconductor chip;
   an insulation layer (420) formed on the front-side portion of the semiconductor chip, wherein the insulation layer includes trenches (431) disposed therein and the trenches have a predetermined depth;
   an elastic buffer layer (445) disposed between the insulation layer and the substrate, wherein the elastic buffer layer crosses each trench to provide a respective cavity (S3);
   lower wiring patterns (415) disposed in the elastic buffer layer, wherein each of the lower wiring patterns includes a landing pad (272) aligned with one of the trenches; and
   interconnection members (312) electrically connecting the landing pads to the substrate,
   wherein each of the interconnection members has one end electrically connected to one of the landing pads and the other end electrically connected to the substrate.

3. The semiconductor package of claim 2, wherein the elastic buffer layer includes:
   a first elastic buffer layer disposed on a surface of the insulation layer facing away from the semiconductor chip and disposed to cover the trenches; and
   a second elastic buffer layer disposed between the first elastic buffer layer and the substrate to cover the lower wiring patterns,
   wherein the second elastic buffer layer includes openings exposing the landing pads.

4. The semiconductor package of claim 2, wherein the insulation layer includes a plurality of insulation materials having different Young's moduli.

5. The semiconductor package of claim 4,
   wherein the insulation layer includes a first insulation material having a Young's modulus of about 2.9 GPa to about 3.2 GPa; and
   wherein the elastic buffer layer includes a second insulation material having a Young's modulus of about 0.01 GPa to about 0.1 GPa.

6. The semiconductor package of claim 5, wherein the first insulation material includes at least one selected from the group consisting of benzocyclobutene and polyimide.

7. The semiconductor package of claim 5, wherein the second insulation material includes one or more of silicone resin and silicone rubber.

8. The semiconductor package of claim 2,
   wherein the insulation layer includes a first surface facing the elastic buffer layer and a second surface bonded to the semiconductor chip, and
   wherein the trenches are spaced apart from each other and are adjacent to the first surface of the insulation layer.

9. The semiconductor package of claim 2,
   wherein the insulation layer further includes inner wiring patterns therein;
   wherein each of the lower wiring patterns comprising the landing pads is connected to one of the inner wiring patterns at least at one surface; and
   wherein the inner wiring patterns are in contact with and connected to chip pads disposed on the front-side portion of the semiconductor chip to electrically connect the chip pads to the lower wiring patterns.

10. The semiconductor package of claim 2, wherein the remaining portions of the lower wiring patterns except for the landing pads are covered with the elastic buffer layer.

11. The semiconductor package of claim 2, wherein the landing pad is spaced apart from a bottom surface of the trench aligned with the landing pad by a predetermined distance.

12. The semiconductor package of claim 8, wherein the lower wiring pattern extends in at least one direction from the landing pad, and further includes a conductive pattern having a curved line shape.

13. The semiconductor package of claim 12, wherein the conductive pattern has a sine wave shape.

14. The semiconductor package of claim 9, wherein the lower wiring pattern further includes:
   a conductive pattern extending from the landing pad in a first direction to be connected to the inner wiring pattern; and
   an extended conductive pattern extending from the landing pad in a second direction opposite to the first direction and extending up to an outside region of the trench,
   wherein the conductive pattern has a curved line shape.

15. The semiconductor package of claim 2, wherein the interconnection members are disposed to be aligned with the trenches, respectively.

16. The semiconductor package of claim 2, wherein each of the interconnection members includes:
   a pillar portion; and
   a protrusion portion extending from an end of the pillar portion to have a hemispherical shape,
   wherein the protrusion portion is connected to one of the lower wiring patterns.

17. The semiconductor package of claim 16, wherein the protrusion portion of the interconnection member includes a solder material.

18. A semiconductor package comprising:
   a first substrate (200) having a first surface (200a) and a second surface (200b) facing away from the first surface; and
   a second substrate (231) disposed over the first surface of the first substrate and having:
      a substrate core (230) having a first surface and a second surface facing away from the first surface, wherein a trench (232a) is disposed in the substrate core to be adjacent to the second surface;
      an elastic buffer layer (220) disposed on the second surface of the substrate core and having an opening (220a) disposed on its surface facing the first substrate, wherein the elastic buffer layer crosses the trench to provide a cavity (S2); and
      a lower wiring pattern (250) disposed inside the elastic buffer layer and having a landing pad (272) disposed to be aligned to the trench; and
      an interconnection member (210) electrically connecting the first substrate to the second substrate, wherein one end of the interconnection member is connected to the lower wiring pattern and the other end is connected to the first substrate.

19. The semiconductor package of claim 18, wherein the second substrate further comprises an outer circuit wiring pattern disposed on the first surface of the second substrate; and
   a via electrode penetrating the second substrate from the first surface to the second surface, wherein one of both ends of the via electrode is connected to the outer circuit wiring pattern and the other end is connected to the lower wiring pattern.

* * * * *